United States Patent [19]

Pospisil

[11] 4,401,940
[45] Aug. 30, 1983

[54] VOLTAGE EQUALIZER BRIDGE

[75] Inventor: Robert S. Pospisil, Palm Bay, Fla.

[73] Assignee: Harris Corporation, Melbourne, Fla.

[21] Appl. No.: 431,229

[22] Filed: Sep. 30, 1982

[51] Int. Cl.³ .............................................. H03F 1/30
[52] U.S. Cl. ........................................ 323/365; 320/1; 363/126
[58] Field of Search ................... 320/1; 323/365, 242, 323/243, 326; 363/126, 61, 60; 318/345 B, 345 D, 345 F, 809, 812; 307/147, 321, 109

[56] References Cited

U.S. PATENT DOCUMENTS 3,681,625  8/1972  Kudelski ............................. 307/321
3,869,676  3/1975  Harrison et al. ................ 307/321 X

*Primary Examiner*—J. V. Truhe
*Assistant Examiner*—Patrick Keane
*Attorney, Agent, or Firm*—Leitner, Palan, Martin & Bernstein

[57] ABSTRACT

A diode equalizing bridge wherein one pair of opposed diodes are forward-biased and a second pair of opposed diodes are reverse-biased so that the two capacitors at the opposed load terminals are charged and discharged by a current source and current sink connected to two opposed power terminals until the capacitors have equal voltages. The current source and sink are gated to activate and deactivate the bridge. For an AC power source, two diode bridges are used, one connected to each terminal of the capacitor to operate during the respective half cycle of the AC power source.

10 Claims, 4 Drawing Figures

VOLTAGE EQUALIZER BRIDGE

BACKGROUND OF THE INVENTION

The present invention relates to voltage equalizer circuits for capacitors. In analog controls circuits, a variable, which is monitored, may be stored as a voltage on a capacitor. In certain applications, it may be desirable to balance the voltages stored on at least two or more capacitors. For example, in a motor control circuit, having three phases of current, the variable stored on the capacitors may be equalized during a portion of the control cycle. This equalizing of voltage would provide a common starting voltage from which the charge of voltage on the capacitors would be varied during the remainder of the monitor or measurement cycle.

With the advent of the monolithic controllers for induction motors, it is desirable that the equalizer include as few as possible elements and preferably operate off the alternating current source used to drive the motor.

SUMMARY OF THE INVENTION

An object of the present invention is to provide a monolithic equalizer for capacitors.

Another object of the present invention is to provide an equalizer for capacitors which can operate with an alternating current source.

An even further object of the present invention is to provide an equalizer for capacitors which may be selectively operable during a given portion of the cycle of an alternating current supply.

These and other objects of the invention are obtained by an equalizer including a diode bridge having opposed power terminals and opposed load terminals. A first pair of opposed diodes of the bridge being forward-biased and a second pair of opposed diodes of the bridge being reverse-biased when the voltage of the capacitor of the first load terminal is less than the voltage of the capacitor at the second load terminal and power is applied to the power teminals. This charges the capacitor at the first load terminal and discharges capacitor at the second load terminal until the voltages are equal. When the voltage of the capacitor of the first load terminal is more than the voltage of the capacitor of the second load terminal, the first pair of diodes are reverse-biased and the second pair of diodes are forward-biased so as to charge the capacitor at the second load terminal and discharge the capacitor at the first load terminal until the voltages are equal. Switches or switchable current source and sinks are provided between the power terminal of the bridge and the power source for permitting equalization when activated and for preventing equalization and preventing discharging of the capacitors when deactivated.

The bridge may be a pair of bridges, one connected to each of the terminals of the capacitor to provide separate control of the positive and negative terminals of the capacitor during the positive and negative portions of an AC power source. The control of the current sources and sinks for each half of cycle is controlled by phase to voltage converters. In a three phase motor, the phase feedback from the motor is used in the input of the phase to voltage converters. The voltage on the capacitor is used to control the driver/switching circuit for one coil of a three phase motor.

Other objects, advantages and novel features of the present invention will become evident upon review of the detailed description of the invention when considered in conjunction with the accompanying drawings.

DESCRIPTION OF THE PREFERRED EMBODIMENTS

Figure 1:
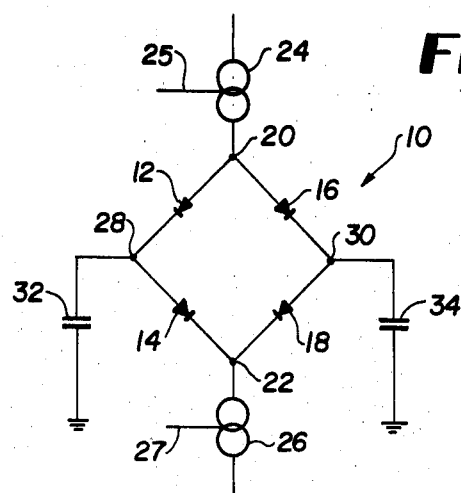
FIG. 1 is a schematic of a voltage equalizer for a pair of capacitors incorporating the principles of the present invention.

A voltage equalizer 10 is illustrated in FIG. 1 and includes a diode bridge having diodes 12, 14, 16 and 18. The bridge includes a pair of opposed power terminals 20 and 22 and a pair of opposed load terminals 28 and 30. The anode of diode 12 is connected to terminal 20 and its cathode is connected to terminal 28. The anode of diode 14 is connected to terminal 28 and its cathode is connected to terminal 22. The anode of diode 16 is connected to terminal 20 and its cathode connected to terminal 30. The anode of diode 18 is connected to terminal 30 and its cathode connected to terminal 22.

A current source 24 is connected to power terminal 20 and a current sink 26 is connected to power terminal 22. A first capacitor 32 is connected to load terminal 28 and a second capacitor 34 is connected to load terminal 30. The current source 24 includes a control gate 25 and the current sink 26 includes a control gate 27. As will be explained fully below, this allows the current source and sink to be activated and deactivated to control the operation of the equalizer 10.

To fully understand the equalizer of FIG. 1, its operation will now be described. With power applied to power terminals 20 and 22 by current source 24 and current sink 26 and when the voltage or charge on capacitors 32 and 34 are connected to load terminals 28 and 30, respectively, are equal, all the diodes 12, 14, 16 and 18 are forward-biased. The current from source 24 is sunk by current sink 26 and the capacitors 32 and 34 maintain their equal charge.

If equalization is not desired, the current source 24 and current sink 26 are deactivated leaving the power terminals 20 and 22 floating such that the diode bridge is inactive and the charge or voltage on the capacitors 32 and 34 are unaffected by the equalizer 10. Without the control of the connection of the power terminals 20 and 22 to the power source, a path may be provided to ground through power terminal 22 which would discharge the capacitors 32 and 34 or a path to the power terminal 20 which could create a charging of the capacitors 32 and 34. Thus, by providing switchable current source 24 and current sink 27, the operation of the equalizer may be controlled and the capacitors connected to the load terminals are unaffected when the equalizer is inactive. It should be noted that the capacitors 32 and 34 are storage devices having a voltage stored thereon representative of a monitored variable in the circuit to be controlled. Thus, the voltage equalizer 10 can be used to equalize the voltage on two capacitors at a controlled point in time at any control system by the use of the gated sources and sinks 24 and 26.

When the voltage on capacitor 32 is greater than the voltage on capacitor 34, diodes 12 and 18 become reverse-biased. Thus, the current source 24 drives or charges the capacitor 34 through diodes 16 and the current sink 26 sinks charge or voltage from capacitor 32 through diode 14. The diodes 12 and 18 remain reverse-biased until the voltage on capacitors 32 and 34 become equal. At this point, diodes 12 and 18 again become forward-biased and the current from current source 24 is sunk totally by the current sink 26.

When the voltage on capacitor 32 is less than the voltage on capacitor 34, diodes 14 and 16 become reverse-biased. The current source 24 charges the capacitor 32 through diode 12 and the current sink 26 discharges the voltage on capacitor 34 through diode 18. When the charge or voltage on capacitor 32 equals the voltage or charge on capacitor 34, diodes 14 and 16 are again forward-biased and the total current from current source 24 is sunk by current sink 26.

Figure 2:
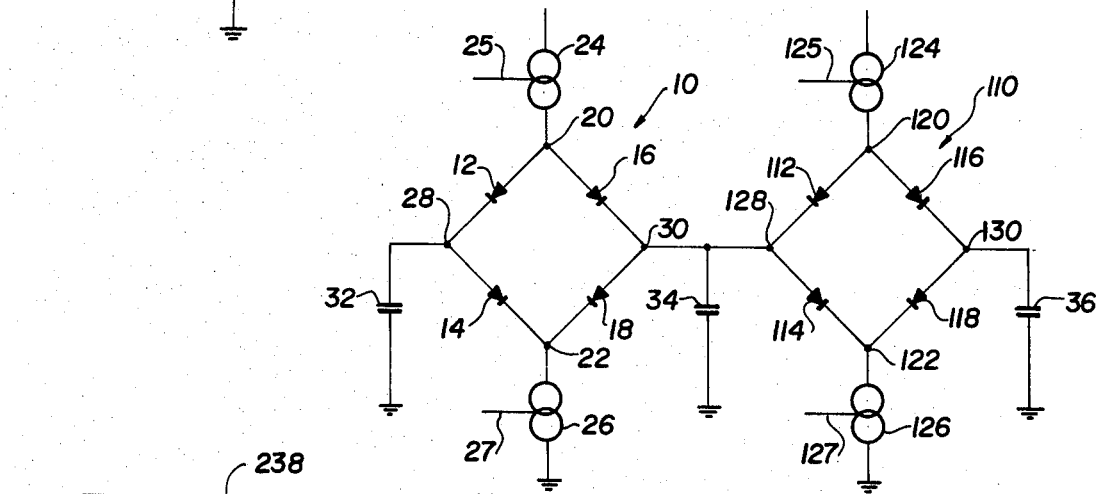
FIG. 2 is a schematic of a pair of equalizers for three capacitors incorporating the principles of the present invention.

The use of a diode equalizing bridge to equalize the voltage on three capacitors, each of which represents a variable monitored in a three phase motor control, is illustrated in FIG. 2. A pair of bridges 10 and 110 are shown. It should be noted that the elements in bridge 110 which have the same function as those in bridge 10 have the same unit and tens digit. The three capacitors which are to be balanced are illustrated as capacitor 32 connected to load terminal 28 of bridge 10, capacitor 34 connected to load terminal 30 of equalizing bridge 10 and load terminal 128 of equalizing bridge 110 of equalizing bridge 110, and capacitor 136 connected to the load terminal 130 of equalizing bridge 110. The bridge, as illustrated, will simultaneously balance the three capacitors. Alternatively, by using the gates 25, 125 on current sources 24, 124 and the gates 27, 127 on current sinks 26, 126, the equalizing bridges 100, 110 may be operated separately.

By way of example, assume that capacitor 32 has a smaller voltage than capacitor 34 and capacitor 35 has a smaller voltage than capacitor 36. For this assumed condition, diodes 14 and 16 of bridge 10 and diodes 114 and 116 of bridge 110 are reverse-biased. Thus, capacitor 32 is charged by current source 24 via diode 12 and capacitor 136 is discharged by current sink 125 via diode 118. Since diode 18 of bridge 10 is conducting and diode 112 of bridge 110 are conducting, the current from current source 124 is sunk by current sink 26. Thus, the charge on capacitor 34 is not initially affected.

If the difference between capacitors 32 and 34 and between 34 and 36 are equal, the charge on capacitor 34 is not affected at all. If the difference between the voltage of capacitors 32 and 34 is greater than the difference between capacitors 34 and 36, then the discharge on capacitor 36 will cause capacitor 36 to have a voltage equal to capacitor 34 before the charging of capacitor 32 would reach the voltage on capacitor 34. At this point, when the charge on capacitors 34 and 36 are equal, diodes 114 and 116 on bridge 110 are conducting and the current source 124 is being sunk by the current sink 126. This will cause the charge on capacitor 34 to be sunk by current sink 26 via diode 18. This decrease in voltage on capacitor 34 will again reverse-bias diodes 114 and 116 causing the charge to be further decreased on capacitor 36. This process will continue until the charge on capacitors 32, 34, and 36 are equal. Thus, it can be seen that only two bridges are needed to perfectly match the voltage on three capacitors.

Figure 3:
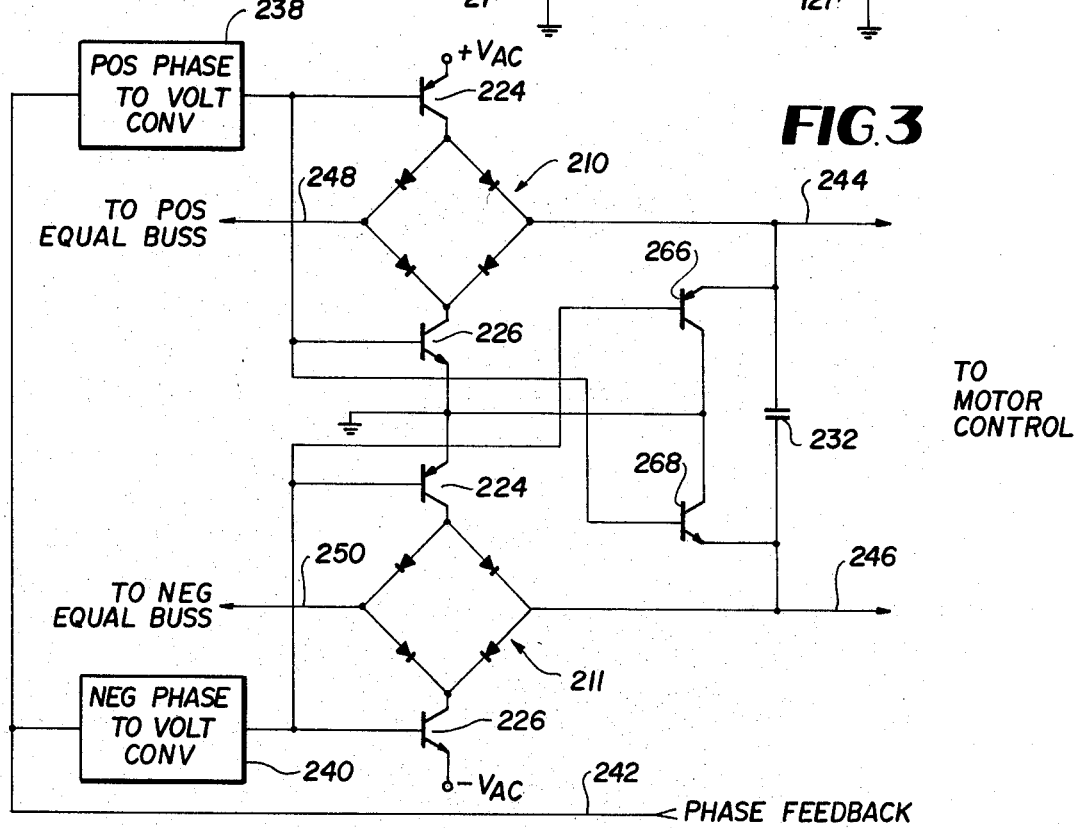
FIG. 3 is a schematic of another embodiment of a voltage amplifier for at least a pair of capacitors incorporating the principles of the present invention.

The application of the equalizer of the present invention using an alternating source of voltage is illustrated in FIG. 3. Although the circuit of FIG. 3 is specifically for a motor control, it should be noted it can be used for equalizing capacitors to be used in any sort of control or measurement circuit. The capacitor 232 has its positive electrode and its negative electrode connected to a motor control by lines 244 and 246 respectively. The equalizer circuit includes two separate diode bridges 210 and 211 connected respectively to the positive and negative terminals of capacitor 232. The positive terminal of the capacitor 232 is connected to a load terminal of bridge 210 and the negative terminal of capacitor 232 is connected to a load terminal of bridge 211.

Each of the diode bridges includes a current source 224 and 224' and current current sinks 226 and 226'. The current sink 226 and current source 224' connect one power terminal of their respective bridges to a common AC return or ground. The current sink 224 connects the other power terminal of bridge 210 to the positive AC voltage +VAC while the current sink 226' connects the other power terminal of bridge 211 to the negative AC voltage −VAC. Current source 224 and current sink 226, illustrated as transitors, are gated on and off by the positive phase to voltage converter 238 and power source 224' and current sink 226' are gated on and off by the negative phase to voltage converter 240. Line 242 provides the phase feedback from the motor as an input to the positive and negative phase to voltage converters 238 and 240 respectively.

A switch 266, illustrated as transitor, connects the positive terminal of capacitor 232 to the ground reference and is controlled by the negative phase to voltage converter 240. A switch 268 illustrated as a transitor, connects the negative terminal of capacitor 232 to the ground and is controlled by the output of the positive phase to voltage converter 238. The switch 266 is turned on during the negative phase to bring the positive terminal of the capacitor 232 to ground while the negative terminal of the capacitor is being equalized. Similarly, the switch 268 is turned on during the positive phase to bring the negative terminal of capacitor 232 up to ground while the positive terminal to be equalized.

Figure 4:
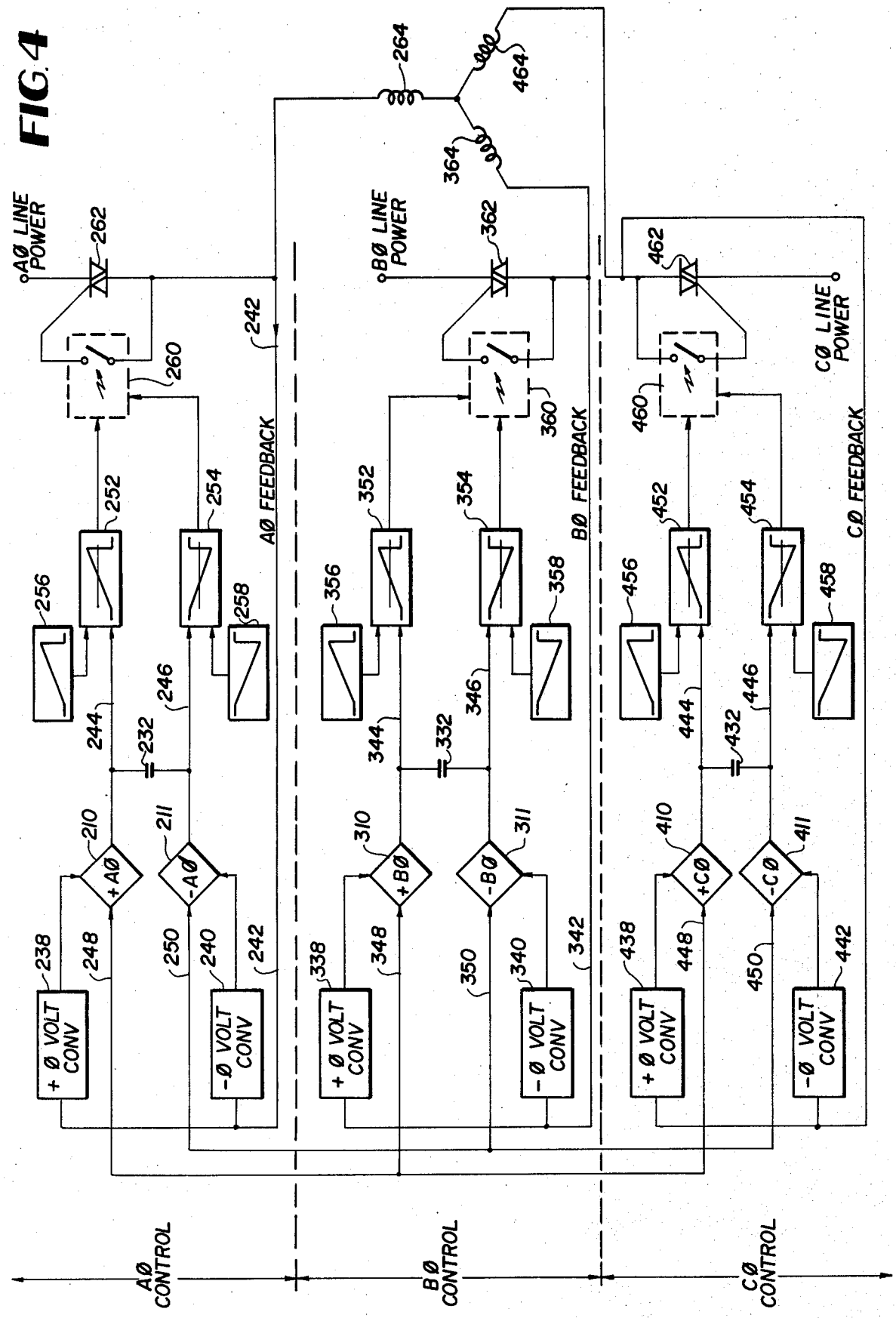
FIG. 4 is a block diagram of the voltage equalizer used in a three phase motor control.

The current sources and sinks 224, 244' and 226 and 226' as well as the positive and negative grounding switches 266 and 268 of FIG. 3 have not been shown in FIG. 4 for sake of clarity and can be considered to be part of the equalizer and the phase to voltage converters' circuits respectively.

Line 248 connects the other load terminal of bridge 210 to the positive equalization buss and line 250 connects the other load terminal of bridge 211 to the negative equalization buss. The positive phase to voltage converter 238 gates on the power sources and sinks 224 and 226 respectively during the positive half cycle to allow equalization of the positive terminal of capacitor 232 with other capacitors connected to the positive equalization buss via line 248. The negative phase to voltage converter 240 gates on current sources and sink 224' and 226' respectively during the negative half cycle to equalize the negative terminal of capacitor 232 with the other capacitors connected to the negative equalization buss via line 250.

The equalizer circuit of FIG. 3 can be applied to a three phase motor as illustrated in FIG. 4. If the three capacitors 232, 332 and 432 do not have some form of equalization, each capacitor in each phase leg of the controller will contain a voltage representing the winding current phase and an error voltage resulting from component mismatch and motor phase inbalance. If the phase voltage variation among the capacitors remain uncorrected, they will cause unsymmetrical firing of the triac resulting in unbalanced motor drive. The equalizer circuit as illustrated in FIG. 4 senses these variations and forces the three capacitors to operate at a voltage resulting in symmetrical phasing of three triacs thereby causing the motors to operate in a balanced manner.

A three phase motor is illustrated in FIG. 4 as including coils 264, 364 and 464 representing phases A, B, and C respectively. Each of the phases are connected to a three phase AC power line via a switchable device illustrated as triac 262, 362 and 462 respectively. The operation of the triacs are controlled by a switch 260, 360 and 460 respectively which are illustrated as an optical coupler or isolation switches. The isolation switches and couplers 260, 360 and 460 are driven respectively by a positive and negative comparators 252, 352, 452 and 254, 354 and 454 respectively. The positive comparators 252, 352 and 452 receive a voltage input from the positive terminal of the capacitors via line 244, 344 and 444 and have a second input from the positive ramp generators 256, 356 and 456 respectively. The negative comparators 254, 354 and 454 receive an input from the negative terminal of the capacitors via lines 246, 346 and 446 and have a second input from the negative ramp generators 258, 358 and 458 respectively. These provide the control signals for the optocoupler or isolation switches 260, 360 and 460 respectively.

The capacitors are connected to the positive and negative equalization buss over lines 248, 348, 448 and 250, 350, 450 via positive and negative equalizer 210, 310, 410 and 211, 311, 411 respectively. The positive equalizer 210, 310 and 410 are controlled by positive phase to voltage converters 238, 338 and 438 respectively and the negative phase equalizers 211, 311 and 411 are controlled by negative phase to voltage converters 240, 340 and 440 respectively. The positive and negative phase to voltage converters are activated and controlled by motor phase feedbacks 242, 342 and 442 from their respective motor coils 264, 364, 464.

The three phase circuit of FIG. 4 is basically that of FIG. 3 applied to three separate capacitors. The operation of the equalizers or diode bridges in FIGS. 3 and 4 is the same as that described for FIGS. 1 and 2 wherein pairs of opposed diodes are forward-biased to provide or take away current from a respective capacitor until the voltage in all the capacitors are equal. The capacitors in the configuration of FIG. 4 are connected by two diode bridges.

As is evident from the description of the preferred embodiments, the objects of the invention are attained in that a alternating current operated voltage equalizer is provided. Although the invention has been described and illustrated in detail, it is clearly understood that the same is by way of illustration and example only and is not to be taken by way of limitation. The spirit and scope of the present invention are to be limited only by the terms of the appended claims.

What is claimed is:

1. A voltage equalizer for a pair of capacitors comprising:
    a diode bridge having first and second opposed power terminals and first and second opposed load terminals;
    a first pair of opposed diodes of said bridge being forward-biased and a second pair of opposed diodes being reverse-biased when the voltage at said first load terminal is less than the voltage at said second load terminal and power is applied to said power terminals to charge and discharge capacitors at said first and second load terminals, respectively, until their voltages are equal; and
    said first pair of opposed diodes being reverse-biased and said second pair of opposed diodes being forward-biased when the voltage at said first load terminal is greater than the voltage at said second load terminal and power is applied to said power terminals to discharge and charge capacitors at said first and second terminals, respectively, until their voltages are equal.

2. A voltage equalizer according to claim 1 including first and second switch means connected between said first and second power terminals and a source of power, respectively, for permitting equalization when activated and preventing equalization when deactivated.

3. A voltage equalizer comprising:
    a current source means;
    a current sink means;
    first and second diodes connected in series between said current source means and said current sink means;
    third and fourth diodes connected in series between said current source means and said current sink means;
    a first capacitor connected to the juncture of said first and second diodes;
    a second capacitor connected to the juncture of said third and fourth diodes;
    said first, second, third and fourth diode transmit the current from said current source means to said current sink means when the voltage of said first and second capacitors are equal;
    said first and fourth diode charge and discharge said first and second capacitors, respectively, via said current source and current sink, respectively, when the voltage of said first capacitor is less than the voltage of said second capacitor; and
    said second and third diodes discharge and charge said first and second capacitors, respectively, via said current sink and current source, respectively, when the voltage of said first capacitor is more than the voltage of said second capacitor.

4. A voltage equalizer comprising:
    a diode bridge having first and second opposed power terminals and third and fourth opposed load terminals;
    a first diode of said bridge interconnects said first and third terminals, a second bridge of said bridge interconnects said third and second terminals, a third diode of said bridge interconnects said first and fourth terminals, and a fourth diode interconnects said fourth and second terminals;
    a first capacitor connected to said third terminal;
    a second capacitor connected to said fourth terminal;
    said first and fourth diodes being forward-biased and said second and third diodes being reverse-biased when the voltage of said first capacitor is less than the voltage of said second capacitor and power is applied to said first and second terminals to charge and discharge said first and second capacitors, respectively, until their voltages are equal; and said second and third diodes being forward-biased and said first and fourth diodes being reverse-biased when the voltage of said capacitor is greater than the voltage of said second capacitor and power is applied to said first and second terminals to discharge and charge said first and second capacitors, respectively, until their voltages are equal.

5. The voltage equalizer according to claim 4, wherein the positive terminal of said first and second capacitors are connected to said third and fourth terminals, respectively, and including a switch means connecting said second terminal of said bridge to the negative terminals of said first and second capacitors for preventing discharging of said first or second capacitor when said switch means is inoperative.

6. A voltage equalizer for first, second and third capacitors having a voltage representing a given characteristic of each phase of a three phase signal comprising:
   a first and second equalizer bridge each having first and second opposed power terminals and first and second opposed load terminals interconnected by diodes;
   said first capacitor being connected to said first load terminal of said first bridge, said second capacitor being connected to said second load terminals of said first and second bridges and said third capacitor being connected to said first load terminal of said third bridge;
   a first pair of opposed diodes of said bridge being forward-biased and a second pair of opposed diodes being reverse-biased when the voltage at said first load terminal is less than the voltage at said second load terminal and power is applied to said power terminals to charge and discharge the capacitors at said first and second load terminals, respectively, until their voltages are equal; and
   said first pair of opposed diodes being reverse-biased and said second pair of opposed diodes being forward-biased when the voltage at said first load terminal and power is than the voltages at said second load terminal and power is applied to said power terminals to discharge and charge the capacitors at said first and second load terminals, respectively, until their voltages are equal.

7. A voltage equalizer according to claim 6 including first and second switch means connected between said first and second power terminals and a source of power for permitting equalization when activated and preventing equalization when deactivated.

8. A voltage equalizer for a pair of capacitors comprising:
   a first diode bridge having first and second opposed power terminals and first and second opposed load terminals;
   a second diode bridge having first and second opposed power terminals and first and second opposed load terminals;
   a first capacitor having its positive and negative terminals connected to said first load terminals of said first and second bridges respectively;
   a second capacitor having its positive and negative terminal connected to said second load terminals of said first and second bridges respectively;
   first switch means connected between said first and second power terminals of said first bridge and a source of power for permitting equalization of the voltages on the positive terminals of said first and second capacitors during the positive portion of said power supply cycle; and
   a second switch means connected between said first and second power terminals of said second bridge and said source of power for permitting equalization of the voltage on the negative terminal of said first and second capacitors during the negative portion of said power supply cycle.

9. A voltage equalizer circuit for first, second and third capacitors each having a voltage representing a given characteristic of each phase of a three phase signal comprising for each capacitor:
   a first diode bridge having first and second opposed power terminals and first and second opposed load terminals;
   a second diode bridge having first and second opposed power terminals and first and second opposed load terminals;
   one of said capacitors having its positive and negative terminals connected to said first load terminals of said first and second bridges respectively;
   a positive buss connected to said second load terminals of said first bridge;
   a negative buss connected to said second load terminal of said second;
   first switch means connected between said first and second power terminals of said first bridge and a source of power for permitting equalization of the voltages on the positive terminals of said first, second and third capacitors during the positive portion of said power supply cycle; and
   a second switch means connected between said first and second power terminals of said second bridge and said source of power for permitting equalization of the voltage on the negative terminal of said first, second and third capacitors during the negative portion of said power supply cycle.

10. A voltage equalizer circuit according to claim 9 wherein said first and second switch means include phase to voltage converters whose phase input is from a coil of a three phase motor.

* * * * *

UNITED STATES PATENT AND TRADEMARK OFFICE
CERTIFICATE OF CORRECTION

PATENT NO. : 4,401,940
DATED : August 30, 1983
INVENTOR(S) : Robert S. Pospisil

It is certified that error appears in the above—identified patent and that said Letters Patent is hereby corrected as shown below:

Column 2, line 14, change "amplifier" to --equalizer--;

Column 4, line 4, before "source" insert --current--;

line 18, delete "current" (first occurance);

line 47, change "244'" to --224'--;

Column 5, line 57, change "a" to --an--;

Column 7, line 42, before "than" insert --greater--;

Column 8, line 41, after "second" insert --bridge--;

In The Drawing, Figure 3, change "224" and "226" in bridge 211 to --224'-- and --226'-- respectively.

Signed and Sealed this

Thirteenth Day of December 1983

[SEAL]

Attest:

GERALD J. MOSSINGHOFF

Attesting Officer

Commissioner of Patents and Trademarks